(12) United States Patent
Poly et al.

(10) Patent No.: US 11,970,780 B2
(45) Date of Patent: Apr. 30, 2024

(54) METHOD FOR MANUFACTURING APPLIQUES ON A DIAL

(71) Applicant: Rubattel & Weyermann S.A., La Chaux-de-Fonds (CH)

(72) Inventors: Giovanni Poly, Villers-le-Lac (FR); Jonas Grobe, Les Ponts-de-Martel (CH); Frédéric Jeanrenaud, La Chaux-de-Fonds (CH)

(73) Assignee: Rubattel & Weyermann S.A., La Chaux-de-Fonds (CH)

( * ) Notice: Subject to any disclaimer, the term of this patent is extended or adjusted under 35 U.S.C. 154(b) by 0 days.

(21) Appl. No.: 18/056,420

(22) Filed: Nov. 17, 2022

(65) Prior Publication Data

US 2023/0227981 A1 Jul. 20, 2023

(30) Foreign Application Priority Data

Dec. 30, 2021 (EP) .................... 21218285

(51) Int. Cl.
| | | |
|---|---|---|
| *C23C 28/02* | (2006.01) | |
| *C23C 14/16* | (2006.01) | |
| *C23C 14/34* | (2006.01) | |
| *C23C 14/58* | (2006.01) | |
| *C25D 5/02* | (2006.01) | |
| *C25D 5/34* | (2006.01) | |
| *C25D 5/48* | (2006.01) | |
| *C25D 7/00* | (2006.01) | |
| *G04D 3/00* | (2006.01) | |

(52) U.S. Cl.
CPC .......... *C23C 28/023* (2013.01); *C23C 14/165* (2013.01); *C23C 14/34* (2013.01); *C23C 14/588* (2013.01); *C25D 5/022* (2013.01); *C25D 5/34* (2013.01); *C25D 5/48* (2013.01); *C25D 7/005* (2013.01); *G04D 3/0048* (2013.01); *G04D 3/0092* (2013.01)

(58) Field of Classification Search
None
See application file for complete search history.

(56) References Cited

U.S. PATENT DOCUMENTS

| | | | |
|---|---|---|---|
| 2011/0203934 A1 | 8/2011 | Rey-Mermet | |
| 2014/0356638 A1 | 12/2014 | Wang et al. | |
| 2016/0263698 A1* | 9/2016 | Noirot | B23K 26/359 |
| 2019/0278182 A1 | 9/2019 | Laforge et al. | |
| 2020/0292996 A1* | 9/2020 | Jeanrenaud | G04B 19/12 |
| 2021/0060605 A1 | 3/2021 | Netuschill et al. | |

FOREIGN PATENT DOCUMENTS

| | | | | |
|---|---|---|---|---|
| EP | 2 182 096 A1 | 5/2010 | | |
| EP | 3 536 826 A1 | 9/2019 | | |
| EP | 3 786 722 A1 | 3/2021 | | |
| EP | 3764169 B1 * | 3/2023 | | G04B 13/02 |
| JP | 2007-101271 A | 4/2007 | | |

OTHER PUBLICATIONS

European Search Report Issued May 20, 2022, in European Application 21218285.1 filed on Dec. 30, 2021 (with English Translation of Categories of Cited Documents), 4 pages.
European Search Report Issued Jul. 13, 2022, in European Application 22161663.4 filed on Mar. 11, 2022 (with English Translation of Categories of Cited Documents), 4 pages.

* cited by examiner

*Primary Examiner* — Louis J Rufo
(74) *Attorney, Agent, or Firm* — Oblon, McClelland, Maier & Neustadt, L.L.P.

(57) ABSTRACT

A method for manufacturing appliques on a dial for a timepiece.

11 Claims, 1 Drawing Sheet

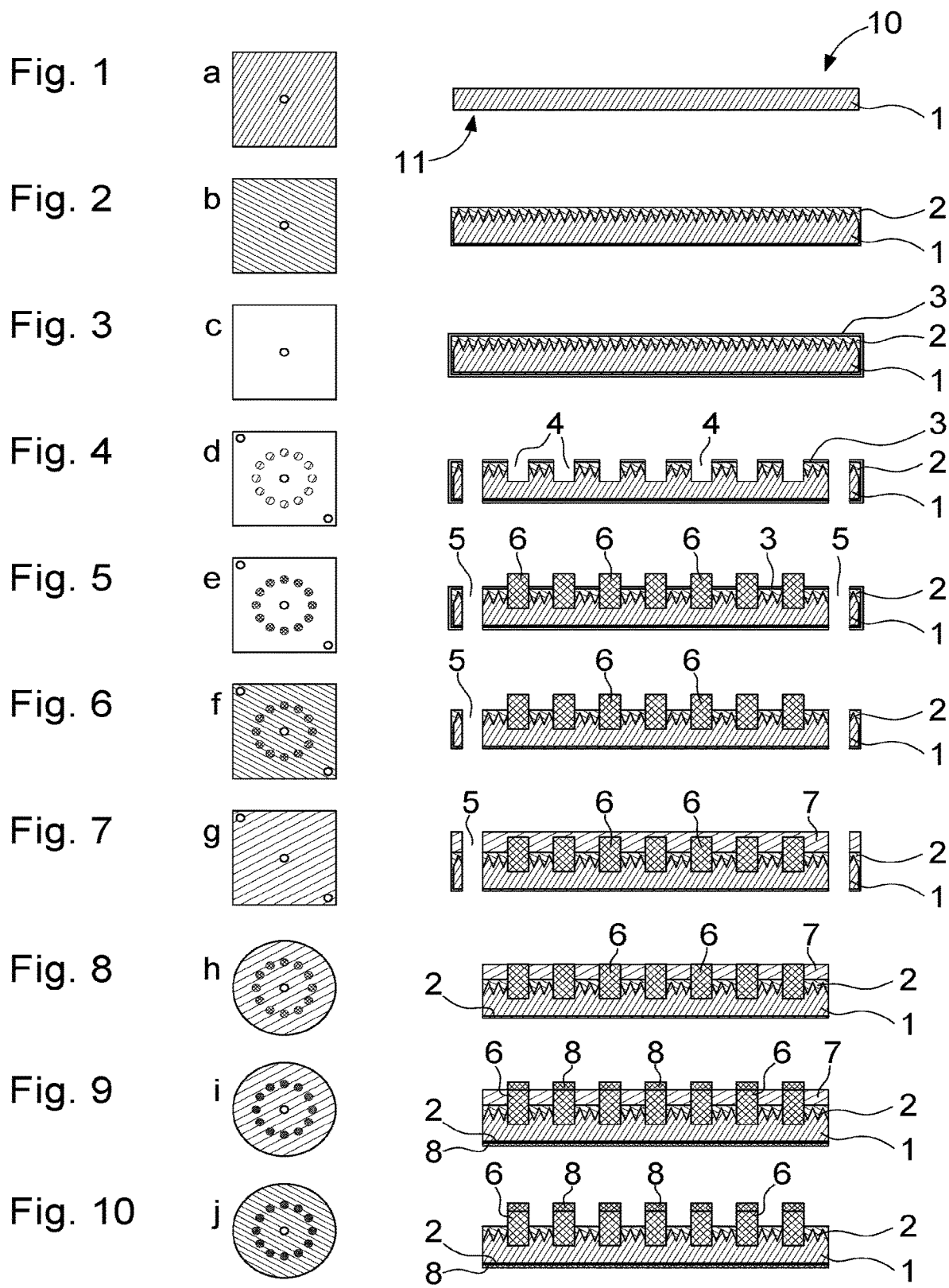

METHOD FOR MANUFACTURING APPLIQUES ON A DIAL

CROSS-REFERENCE TO RELATED APPLICATIONS

This application claims priority to European Patent Application No. 21218285.1 filed on Dec. 30, 2021, and European Patent Application No. 22161663.4 filed on Mar. 11, 2022, the entire disclosures of which are hereby incorporated herein by reference.

PURPOSE OF THE INVENTION

The present invention relates to a method for manufacturing appliques on a dial for a timepiece.

TECHNOLOGICAL BACKGROUND

The present invention aims to improve the methods for depositing decorative patterns on the surface of a horological component.

A timepiece dial typically includes appliques used to decorate it. For example, these appliques can represent an hour circle for more easily determining the time in relation to the location of the hands of the timepiece. These appliques can also be used to simply add an aesthetic appeal to the dial.

Typically, these appliques are mounted on the dial by successive bonding and optionally masking and/or stamping steps which, in addition to the cost of the appliques, leads to additional manufacturing costs due to the required positioning accuracy, which is all the greater the thicker the applique is.

SUMMARY OF THE INVENTION

The present invention relates to a method for manufacturing appliques on a dial for a timepiece, characterised in that it comprises the following steps of:
a) providing a dial, the dial having a front face and a rear face;
b) carrying out a surface preparation treatment on the front face;
c) depositing a first protective layer all around the dial provided with the at least one decorative layer;
d) machining at least one recess in the first protective layer and the decorative layer to form a mould for future appliques, and boring the dial to form at least one adhesion point;
e) filling said at least one recess with a material by electroplating on the dial to form the appliques;
f) removing the first protective layer;
g) depositing a second protective layer on the front face of the dial to cover the dial and the appliques;
h) cutting the dial to the desired dimensions and polishing the second protective layer and the appliques over a predetermined height;
i) carrying out a selective surface treatment on the tip of the appliques;
j) removing the second protective layer.

According to other advantageous alternative embodiments of the invention:
the dial is made of a material selected from copper alloys, iron alloys, gold alloys or silver alloys;
the decorative layer is made of a material selected from silver, gold, copper, nickel, rhodium or ruthenium;
the first protective layer and the second protective layer are resin-based;
the resin is selected from acrylic resins, nitro-cellulosic resins, alkyd resins or polyurethane resins;
said material filling the at least one recess is selected from silver, gold, copper, nickel, rhodium or ruthenium;
the first and second protective layers are removed by means of a solvent or plasma;
the etching of the at least one recess is carried out by a laser etching method allowing the metal layer and the first protective layer to be etched;
in step b), the surface preparation of the face consists of polishing, pumicing and/or dry or wet sanding the front face of the dial.
in step b), the surface treatment of the front face is a shot-blasting, sunbursting, engine-turning, etching, milling, snailing, circular graining, or any other operation for obtaining a decorative pattern.

BRIEF DESCRIPTION OF THE FIGURES

FIGS. 1 to 10 show the successive steps of a preferred example of a decoration method according to the invention.

DETAILED DESCRIPTION OF THE INVENTION

The method according to the invention will be better understood with reference to FIGS. 1 to 10. In a first step a) illustrated in FIG. 1, the method according to the invention consists of providing a dial 1 comprising a front face 10 and a rear face 11, the front face being intended to receive the appliques.

Preferably and according to the invention, the dial is made of a material selected from copper alloys, iron alloys, gold alloys or silver alloys.

Of course, as an alternative to using a dial made of an electrically conductive material, a dial made of any material coated with an electrically conductive layer can also be used. For example, a ceramic dial coated with a silver layer could be envisaged.

As illustrated in FIG. 2, the second step b) of the method consists of firstly carrying out a surface preparation treatment on the front face 10, then selectively patterning the front face 10 in order to locally modify the surface condition thereof, and finally depositing thereon at least one decorative layer 2 over the entire dial.

The surface preparation of the front face 10 consists of polishing, pumicing and/or dry or wet sanding the front face of the dial. Plasma or laser treatment is also possible.

The patterning of the front face of the dial is a conventional horological decoration operation. Thus, patterning is an operation carried out by shot-blasting, sunbursting, engine-turning, etching, milling, snailing, circular graining, or any other operation for giving a decorative pattern, or any other operation allowing a decorative pattern to be obtained. This step is intended both to decorate the dial and to increase the adhesion of the surface of the dial for the deposition of the decorative layer.

The decorative layer 2 is made of a material selected from silver, gold, copper, nickel, rhodium, ruthenium or any other possible coating that can be obtained by wet process (chemical or electrolytic deposition) or by dry process (sputtering, PVD).

Optionally, in order to improve the mechanical stability of the interface between the decorative layer 2 and the dial 1, an intermediate adhesive layer can advantageously be deposited between the decorative layer 2 and the dial 1. For example, titanium generally has adequate adhesion on most typical substrates. This layer can be extremely thin: a few nm are generally sufficient to considerably improve adhesion.

The metal layer deposited on the surface of the dial has good adhesive properties, promoting the adhesion of the appliques formed. The material from which the layer is made can be titanium, nickel, gold or another material and/or combination of a plurality of layers.

Preferably, the decorative layer is made by physical vapour deposition (PVD), however, other types of deposition are possible such as electroplating, chemical vapour deposition (CVD) or atomic layer deposition (ALD).

As illustrated in FIG. 3, the third step c) of the method consists of covering the entire dial with a polymer layer 3 by spraying, immersion or spin coating, and then curing the resin 3 by means of heat or UV radiation. Of course, the thickness of the layer will depend on the desired size of the appliques; preferably the thickness of the layer is comprised between 0.02 mm and 0.40 mm.

The resin 3 is selected from acrylic resins, nitro-cellulosic resins, alkyd resins or polyurethane resins.

Alternatively, the dial 1 can be completely covered with resin 3, then cured, and the top of the resin layer can be machined to make the upper part thereof perfectly planar.

As illustrated in FIG. 4, the fourth step d) of the method consists of machining at least one recess 4 in the protective layer and the decorative layer to form a mould for future appliques. In this step, the dial is also bored in several places to form at least one adhesion point 5 for the galvanic growth in the next step.

Advantageously, the at least one recess 4 is formed by a laser method or by photolithography using a positive or negative photoresist, in order to easily control the geometry of the future applique, to make recesses 4 with walls that are essentially perpendicular to the surface of the dial 1, to quickly etch numerous parts, and finally, to finely control the surface condition of the etched area.

As illustrated in FIG. 5, the fifth step e) of the method consists of depositing a material by electroplating on the front face 10 of the electrically conductive dial 1 to form at least one applique 6 in a single step. The dial 1 is immersed in a galvanic bath via the at least one adhesion point 5, which also allows the dial 1 to be used as a cathode.

The material used to fill the at least one recess 4 and form the applique 6 on the dial 1 is selected from silver, gold, copper, nickel, rhodium or ruthenium.

The material used to form the appliqué 6 can be different from that used for the decorative layer depending on the desired aesthetic outcome.

As illustrated in FIG. 6, the sixth step f) of the method consists of freeing the dial 1 from the first resin layer 3 via dissolution, scouring or plasma. Preferably, an organic solvent adapted to the deposited resin is used to remove the first protective layer.

As illustrated in FIG. 7, the seventh step g) of the method consists of covering the front face 10 of the dial 1 with a second protective resin layer 7 by spraying, and then curing the resin 7 via heat or UV radiation. The thickness of this second resin layer is at least equivalent to the height of the appliques 6 formed in step e), and preferably greater than the height of the appliques 6.

The resin 7 forming the second protective layer is selected from acrylic resins, nitro-cellulosic resins, alkyd resins or polyurethane resins.

As illustrated in FIG. 8, the eighth step h) of the method consists firstly of machining the dial 1 to the desired dimensions and shape, then polishing the protective resin layer 7 and the appliques 6 over a predetermined height.

As illustrated in FIG. 9, the ninth step i) of the method consists of carrying out a selective surface treatment on the top of the appliques 6.

The selective surface treatment consists of depositing a metal layer 8 by physical vapour deposition (PVD), chemical vapour deposition (CVD), atomic layer deposition (ALD) or wet process (galvanic treatment).

As illustrated in FIG. 10, the tenth and final step j) of the method consists of removing the second protective layer and releasing the dial 1 with its appliques 6.

Feet can be welded to the dials at different steps of the process to facilitate the handling of the parts and/or to meet the product specifications. These feet can be used as a contact point to produce the coatings 2 or to form the appliques 6 by electroforming. In the latter case, these feet are used instead of the bores 5.

It is thus understood that the method, advantageously according to the invention, allows the advantages of machining, photolithography and electroplating to be applied to electroform, in a single electroplating step, the appliques on a dial with very high structural accuracy.

It goes without saying that the present invention is not limited to the example shown but that various alternatives and modifications that may be apparent to a person skilled in the art can be made thereto.

Furthermore, the preferred embodiments or alternative embodiments of the method according to the invention are only provided as an example embodiment of the invention without limitation thereto. Other materials or other material removal or patterning methods can thus be considered.

The invention claimed is:

1. A method for manufacturing appliques on a dial for a timepiece, comprising:
   providing the dial, the dial having a front face and a rear face;
   carrying out a surface preparation treatment on the front face, then selectively structuring the front face and depositing thereon at least one decorative layer;
   depositing a first protective layer all around the dial provided with the at least one decorative layer;
   machining at least one recess in the first protective layer and the decorative layer to form a mould for future appliques, and boring the dial to form at least one adhesion point;
   filling said at least one recess with a material by electroplating on the dial to form the appliques;
   removing the first protective layer;
   depositing a second protective layer on the front face of the dial to cover the front face of the dial and the appliques;
   cutting the dial to desired dimensions and polishing the second protective layer and the appliques over a predetermined height;
   carrying out a selective surface treatment on a tip of the appliques; and
   removing the second protective layer.

2. The method according to claim 1, wherein the dial is made of a material selected from copper alloys, iron alloys, gold alloys or silver alloys.

3. The method according to claim 1, wherein the decorative layer is made of a material selected from silver, gold, copper, nickel, rhodium or ruthenium.

4. The method according to claim 1, wherein the first protective layer and the second protective layer are resin-based.

5. The method according to claim 4, wherein the resin is selected from acrylic resins, nitro-cellulosic resins, alkyd resins or polyurethane resins.

6. The method according to claim 1, wherein said material filling the at least one recess is selected from silver, gold, copper, nickel, rhodium or ruthenium.

7. The method according to claim 1, wherein a metal layer from the selective surface treatment comprises an adhesive layer comprising titanium.

8. The method according to claim 1, wherein the first and second protective layers are removed with a solvent.

9. The method according to claim 1, wherein an etching of the at least one recess is carried out by a laser etching method allowing a metal layer from the selective surface treatment and the first protective layer to be etched.

10. The method according to claim 1, wherein in the carrying out the surface preparation treatment, the surface preparation treatment of the front face consists of polishing, pumicing and/or sanding the front face of the dial.

11. The method according to claim 1, wherein in the carrying out the surface preparation treatment, the surface preparation treatment of the front face is a shot-blasting, sunbursting, engine-turning, etching, milling, snailing, or circular graining operation.

\* \* \* \* \*